United States Patent
Boyer et al.

(10) Patent No.: US 6,265,286 B1
(45) Date of Patent: Jul. 24, 2001

(54) PLANARIZATION OF LOCOS THROUGH RECESSED REOXIDATION TECHNIQUES

(75) Inventors: Michelle A. Boyer, Dallas; Sarma Gunturi, Richardson; Catherine M. Huber, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/190,747

(22) Filed: Nov. 12, 1998

Related U.S. Application Data

(60) Provisional application No. 60/065,837, filed on Nov. 17, 1997.

(51) Int. Cl.$^7$ .................................................. H01L 21/76
(52) U.S. Cl. ............................ 438/443; 438/439; 438/452
(58) Field of Search ..................... 438/439, 443, 438/452, FOR 221, FOR 229, FOR 230

(56) References Cited

U.S. PATENT DOCUMENTS 5,726,093 * 3/1998 Yoo ........................................ 438/443
5,789,305 * 8/1998 Peidous ................................. 438/439

\* cited by examiner

*Primary Examiner*—Long Pham
(74) *Attorney, Agent, or Firm*—Wade James Brady, III; Frederick J. Telecky, Jr.

(57) ABSTRACT

A method of fabricating a semiconductor device which includes providing a silicon substrate having a patterned mask thereover to expose a portion of the surface of the substrate. The exposed surface portion is oxidized to form a sacrificial silicon oxide region to a predetermined depth in the substrate at the exposed portions of the substrate. The sacrificial silicon oxide is then removed by a HF etch and a second region of silicon oxide is formed in the substrate in the region from which the sacrificial silicon oxide was removed. The step of removing the silicon oxide also includes removing a portion of the pad oxide. The sacrificial silicon oxide has a thickness less than the second region of silicon oxide which is from about 10 percent to about 30 percent of the thickness of the second region of silicon oxide. The oxidation steps are thermal oxidation steps in an oxygen-containing ambient.

20 Claims, 1 Drawing Sheet

PLANARIZATION OF LOCOS THROUGH RECESSED REOXIDATION TECHNIQUES

This application claims priority under 35 USC § 119 (e)(1) of provisional application No. 60/065,837, filed Nov. 17, 1997.

BACKGROUND OF THE INVENTION

1. Field of the Invention

This invention relates to fabrication of semiconductor devices and, more specifically, to a procedure for fabrication of field oxide.

2. Brief Description of the Prior Art

In the fabrication of semiconductor devices and particularly integrated circuits and with reference to FIG. 1a, active or moat regions 23 are generally isolated from each other. This is accomplished by deposition of a hard mask 27, generally in the form of a nitride, over silicon dioxide which grows over the wafer of semiconductor material with apertures being formed in the nitride in a predetermined pattern, generally by etching, down to the oxide on semiconductor material in the pattern of the isolation region. The wafer is then heated in an oxidizing ambient, preferably by steam, to grow a field oxide 21 in the unmasked or apertured regions of the mask. As the dimensions of the semiconductor components and particularly the moat regions and the field oxide regions have decreased and particularly when the active regions have dimensions of 0.4 microns and less, a nitride mask is required which has less bending capability than was used in the prior art, such prior art masks generally being about 1300 Angstroms in thickness over about 400 Angstroms of oxide. This has generally been accomplished by providing a thicker nitride mask of at least 1600 Angstroms and above and a thinner oxide mask of about 200 Angstroms. A problem with the use of the thicker nitride and thinner oxide mask is that, since there is essentially no bending of the nitride mask, the oxide formed, which has approximately twice the volume of the silicon which was used in its formation, grows straight up and creates regions of very high stress, particularly in those corner regions 29 where the enlarged volume of field oxide contacts the nitride mask. The nitride is then removed using a wet chemical etch process, this process initially using HF to remove any oxide that has been formed on the surface of the nitride during the thermal oxidation with subsequent removal of the nitride. Since the regions of high stress etch much more rapidly in HF than those regions not under stress and since HF is an etchant for silicon oxide, the oxide in the regions of high stress will be removed much more rapidly than the oxide formed on the unstressed or much less stressed field oxide. In addition, whenever the regions of oxide which are under high stress are subjected to HF during later processing, this will etch at a much faster rate than will any other unstressed and less stressed oxide regions. The result is that, after nitride removal, the field oxide 21 which defines the moat or active region 23 contains an escalloped region 25 where the high stress oxide existed and was removed by the HF as shown in FIG. 1b. This results in a reduced usable flat surface region 13 on the field oxide as described.

A problem resulting from the reduced field oxide surface is that, in the subsequent processing, it is often necessary to provide a narrow slot over the field oxide which, with present technology, will have a pitch of 1.5 microns or less. Since the dimensions of the slot approach the width of the field oxide surface region 21, it is important to maintain the flat portion 13 of the surface of the field oxide as wide as possible to provide tolerance for some misalignment of the slot. This tolerance requirement is diminished in the prior art due to the etching away of the portion 25 of the field oxide 29 under stress. It is therefore apparent that a technique is desirable which will retain the portion of the field oxide now removed and which will relieve the stress on the field oxide.

SUMMARY OF THE INVENTION

In accordance with the present invention, there is provided a technique for uniform formation of moat dimensions of 0.4 micron and less across a wafer. The benefits of this type of control are 1) the ability to control moat dimensions more easily without threat of over-etching oxide to expose the vertical edge of the moat (also known as creating a "shark's tooth"), 2) less oxidation under the moat nitride mask to reduce the hydrofluoric acid etch time necessary to remove this oxide during subsequent processing operations and 3) greater control of critical moat width across the wafer. In addition, the technique in accordance with the present invention planarizes the isolation oxide, thus eliminating the steep oxide sidewall which naturally occurs when using a 2000 Angstrom nitride mask. This is especially beneficial to 0.5 micron Flash EPROM devices which have a subsequent processing step in which polysilicon is etched away from the top of the field oxide. Critical alignment is necessary. Under standard processing conditions, slight misalignment can lead to filaments and other device problems.

Briefly, the above is accomplished by the use of a thin sacrificial oxide having a thickness of from about 10 percent to about 30 percent and preferably about 20 percent of the thickness of the desired final field oxide. Initially, the wafer is patterned with the nitride mask, etched and thermally oxidized as in the prior art for fabrication of LOCOS but for a shorter time than for standard LOCOS formation in order to provide the oxide with reduced thickness, the thickness of this oxide being from about 600 to about 1400 and preferably about 1000 Angstroms or about 20 percent of the thickness of the final field oxide for a device having a pitch of about 1.5 microns from active area to active area. This sacrificial oxide is removed with a hydrofluoric acid etch, leaving a recessed cavity in the silicon with some undercutting of the oxide under the nitride mask since the acid etch will also laterally etch some of the oxide beneath the nitride mask. Finally, the target field oxide is grown for isolation in standard manner. The resultant isolation is very planar and moat widths of 0.4 microns or less are very controllable.

The above described procedure is very simple compared with other prior art techniques for obtaining very small active areas and step height reduction of the isolation regions which require several addition processing steps as well as complicated etch techniques. The above described process does not require additional types of films as in the case of such techniques as poly-buffered LOCOS. In addition, the extra processing is complete in two steps, a thin oxidation and HF strip, so it does not add much cycle time to the process flow.

DESCRIPTION OF THE PREFERRED EMBODIMENT

Figure 1A:
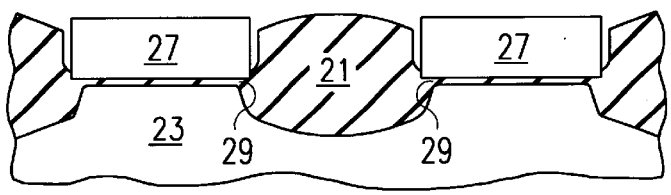
FIG. 1a is a typical profile of a portion of a partially fabricated semiconductor chip for standard field oxidation.
Figure 1B:
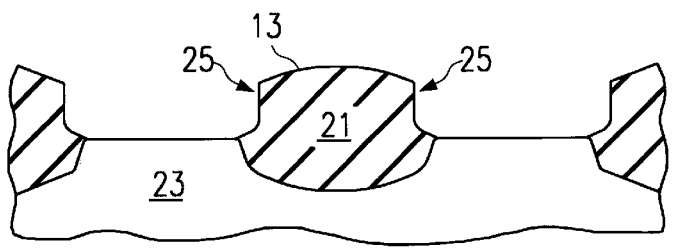
FIG. 1b is a view of the partially fabricated semiconductor chip of FIG. 1a after removal the nitride mask.
Figure 2A:
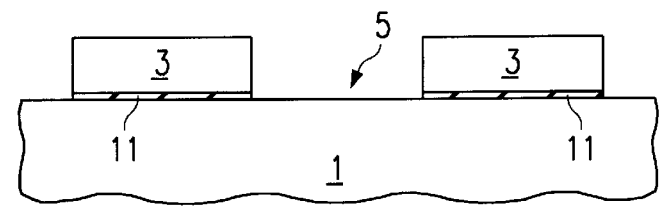
FIGS. 2a to 2e are a process flow for providing a field oxide in accordance with the technique of the present invention.
Figure 2B:
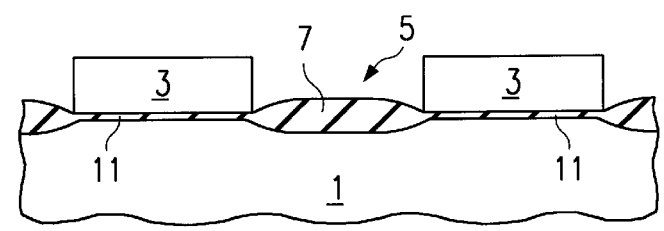
Figure 2C:
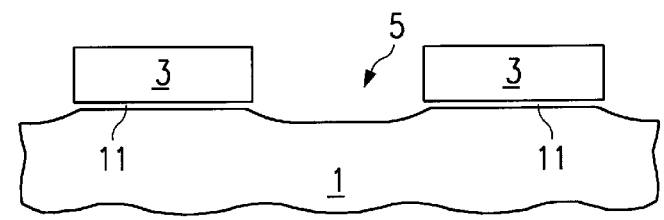
Figure 2D:
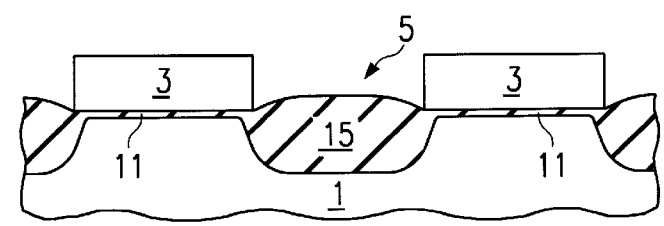
Figure 2E:
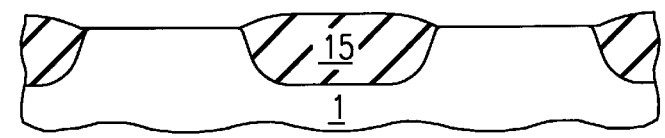

Referring first to FIG. 2a, there is shown a partially fabricated standard semiconductor chip having a silicon substrate 1 with a standard pad oxide 11 and a nitride mask 3 thereover which has been patterned and etched in standard manner to provide apertures 5 therein. The chip is then heated in an oxygen-containing atmosphere in standard manner to grow a thin sacrificial oxide 7 which is the same as the standard field oxide except that it has about one-fifth the thickness of the standard field oxide for the size of the device and in the preferred embodiment about 1200 Angstroms as shown in FIG. 2b. The sacrificial oxide 7 is then removed by use of HF, leaving a cavity in the substrate 1 and slightly undercutting the nitride mask 3 by removal of a portion of the pad oxide 11 thereunder as shown in FIG. 2c. The chip is then again subjected to heating in an oxygen-containing atmosphere to grow a field oxide 15 of the same thickness as used in the prior art. As can be seen in FIG. 2d, the field oxide 15 now extends farther into the substrate than in the prior art due to the removal of the portion of the substrate used to form the sacrificial oxide. In addition, the field oxide does not extend above the surface of the substrate to the degree found in the prior art since it is positioned deeper into the substrate, thereby improving the planarity of the final device. The remaining pad oxide 11 and mask 3 can then be removed in standard manner as shown in FIG. 2e, leaving the field oxide 15 which extends farther into the substrate 1 than in the prior art and does not extend as far above the substrate 1 as in the prior art to provide improved planarity.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a semiconductor device which comprises:
   (a) providing a silicon substrate having a surface and having a patterned mask over the surface to expose a portion of the surface of the substrate;
   (b) oxidizing said exposed surface to form a sacrificial silicon oxide region to a predetermined depth in said substrate at the exposed portions of said substrate;
   (c) removing said sacrificial silicon oxide; and
   (d) forming a second region of silicon oxide in said substrate in the region from which said sacrificial silicon oxide was removed having a thickness.

2. The method of claim 1 further including a pad oxide between said mask and said substrate, wherein said step of removing said sacrificial silicon oxide also includes removing a portion of said pad oxide.

3. The method of claim 1 wherein said sacrificial silicon oxide has a thickness less than said second region of silicon oxide.

4. The method of claim 2 wherein said sacrificial silicon oxide has a thickness less than said second region of silicon oxide.

5. The method of claim 1 wherein said sacrificial silicon oxide has a thickness from about 10 percent to about 30 percent of the thickness of said second region of silicon oxide.

6. The method of claim 2 wherein said sacrificial silicon oxide has a thickness from about 10 percent to about 30 percent of the thickness of said second region of silicon oxide.

7. The method of claim 1 wherein each of steps (b) and (d) comprise thermal oxidation in an oxygen-containing ambient.

8. The method of claim 2 wherein each of steps (b) and (d) comprise thermal oxidation in an oxygen-containing ambient.

9. The method of claim 3 wherein each of steps (b) and (d) comprise thermal oxidation in an oxygen-containing ambient.

10. The method of claim 4 wherein each of steps (b) and (d) comprise thermal oxidation in an oxygen-containing ambient.

11. The method of claim 5 wherein each of steps (b) and (d) comprise thermal oxidation in an oxygen-containing ambient.

12. The method of claim 6 wherein each of steps (b) and (d) comprise thermal oxidation in an oxygen-containing ambient.

13. The method of claim 1 wherein said step of removing includes the step of etching away said sacrificial silicon oxide region.

14. The method of claim 2 wherein said step of removing includes the step of etching away said sacrificial silicon oxide region.

15. The method of claim 3 wherein said step of removing includes the step of etching away said sacrificial silicon oxide region.

16. The method of claim 4 wherein said step of removing includes the step of etching away said sacrificial silicon oxide region.

17. The method of claim 5 wherein said step of removing includes the step of etching away said sacrificial silicon oxide region.

18. The method of claim 6 wherein said step of removing includes the step of etching away said sacrificial silicon oxide region.

19. The method of claim 10 wherein said step of removing includes the step of etching away said sacrificial silicon oxide region.

20. The method of claim 12 wherein said step of removing includes the step of etching away said sacrificial silicon oxide region.

* * * * *